US 11,555,901 B2

(12) United States Patent
Bolatkale et al.

(10) Patent No.: US 11,555,901 B2
(45) Date of Patent: Jan. 17, 2023

(54) PHOTON-BASED DETECTION USING SINGLE-CHANNEL TIME-TO-DIGITAL CONVERSION

(71) Applicant: NXP B.V., Eindhoven (NL)

(72) Inventors: Muhammed Bolatkale, Delft (NL); Dongjin Son, Eindhoven (NL); Maxim Kulesh, Hamburg (DE)

(73) Assignee: NXP B.V., Eindhoven (NL)

( * ) Notice: Subject to any disclaimer, the term of this patent is extended or adjusted under 35 U.S.C. 154(b) by 381 days.

(21) Appl. No.: 16/939,875

(22) Filed: Jul. 27, 2020

(65) Prior Publication Data

US 2022/0026543 A1    Jan. 27, 2022

(51) Int. Cl.
*G01S 7/48* (2006.01)
*G01S 7/4865* (2020.01)
*G01S 7/4863* (2020.01)
*H01L 31/107* (2006.01)

(52) U.S. Cl.
CPC .......... *G01S 7/4865* (2013.01); *G01S 7/4863* (2013.01); *H01L 31/107* (2013.01)

(58) Field of Classification Search
CPC . G01S 7/48; G01S 17/00; G01S 17/04; G01S 17/06; G01S 17/66; G01S 17/88; G01J 1/44; H01L 31/12; H01L 31/107
USPC ...................................................... 250/214 R
See application file for complete search history.

(56) References Cited

U.S. PATENT DOCUMENTS

| 9,176,241 | B2* | 11/2015 | Frach .................... G01T 1/2018 |
| 9,516,244 | B2 | 12/2016 | Borowski |
| 9,625,580 | B2 | 4/2017 | Kotelnikov et al. |
| 9,874,629 | B2 | 1/2018 | Kostamovaara |
| 10,386,487 | B1 | 8/2019 | Wilton et al. |
| 2013/0300838 | A1 | 11/2013 | Borowski |
| 2017/0052065 | A1 | 2/2017 | Sharma et al. |
| 2017/0131143 | A1 | 5/2017 | Andreou et al. |
| 2018/0364337 | A1 | 12/2018 | Wilton |
| 2019/0250257 | A1 | 8/2019 | Finkelstein et al. |
| 2020/0174120 | A1 | 6/2020 | Steigemann et al. |

OTHER PUBLICATIONS

Kostamovaara, Juha, et al. "On laser ranging based on high-speed/energy laser diode pulses and single-photon detection techniques." IEEE Photonics Journal 7.2 (2015): 1-15.
C. Niclass, et al., "A 128×128 Single-Photon Image Sensor With Column-Level 10-Bit Time-to-Digital Converter Array," in IEEE Journal of Solid-State Circuits, vol. 43, No. 12, pp. 2977-2989, Dec. 2008.
H. Seo, et al., "CMOS depth sensor with programmable filter circuits for environment-adaptive noise suppression," in Electronics Letters, vol. 54, No. 19, pp. 1122-1124, Sep. 20, 2018.

\* cited by examiner

Primary Examiner — Que Tan Le

(57) ABSTRACT

Example aspects are directed to operating a SPAD receiver such as may be used in a light detection and ranging (Lidar) system. In one example, the SPAD receiver has SPAD circuitry for multiple photon detections using a single-channel TDC (time-to-digital converter), and such photon detection is quenched after detection so as to establish an effective pre-defined OFF period. In response, the SPAD circuitry is recharged for a subsequent ON period during which the SPAD circuitry is unquenched (or armed) for further photon detection and processing.

18 Claims, 6 Drawing Sheets

PHOTON-BASED DETECTION USING SINGLE-CHANNEL TIME-TO-DIGITAL CONVERSION

OVERVIEW

Aspects of various embodiments are directed to use of optics to detect the position of objects in target areas by use of single-photon avalanche photodiode (SPAD) technology as used for light detection and ranging (Lidar) as well as other purposes.

SPAD technology and Lidar play increasingly important roles in many technology areas. One such area is in the field of range detection as may be used in sensing the relative movement of objects. In vehicular applications, this type of detection may be used for providing assistance in connection with both non-autonomous driving and, due to high range and angular resolutions, autonomous driving. SPAD is an advantageous receiver technology for automotive Lidar thanks to its unique properties such as high sensitivity down to a single photon, high time resolution and high array resolution which may be enabled by planar device structure (e.g., CMOS-based SPAD).

SPAD also facilitates effective techniques for time-of-flight measurements for short-range and low-noise environment applications, such as fluorescence lifetime microscopy. Adapting SPAD for a long-range and high noise environment, in addition to optical bandpass filter and limited field-of-view, requires comprehensive range-gating technique due to the blocking of the signal by noise-induced detections, for example, sunlight photons.

Realizing effective use of SPAD over longer ranges, with enhanced accuracy and/or in higher noise environments, for a variety of applications, presents many challenges.

SUMMARY OF CERTAIN ASPECTS

Various example embodiments are directed to issues such as those addressed above and/or others which may become apparent from the following disclosure concerning operation of a SPAD receiver such as may be used in a Lidar (Light Detection and Ranging) system.

According to certain example aspects, the present disclosure is directed to operating a SPAD receiver such as may be used in connection with a Lidar system. The SPAD receiver has SPAD circuitry for multiple photon detections using a single-channel TDC (time-to-digital converter), and such photon detection is quenched after detection so as to establish an effective pre-defined OFF period. In response, the SPAD circuitry is recharged for a subsequent ON period during which the SPAD circuitry is unquenched (or armed) for further photon detection and processing. Such processing may include range calculations.

In certain more specific examples, aspects of the present disclosure involve operating such a SPAD receiver as above asynchronously in order to enable the multiple photon detections using the single-channel TDC.

In yet further specific examples, aspects of the present disclosure concern: setting the predetermined OFF period to be longer than an after-pulse period, associated with the detection time instance (or instance of a detection of a photon); avoiding device intrinsic noise-induced photon detection; driving the single-channel TDC in response to events for measuring time difference between sets of two consecutive photon counts; and recording time-difference measurements for corresponding Times-of-flight (ToF) for respective photon detections.

In other specific examples, aspects of the present disclosure are directed to systems and circuit arrangements implemented consistent with one or more of the above aspects. For instance, such systems and circuit arrangements may have the SPAD receiver including one of any of a combination of the following: a transmitter illuminator, a transmitter driver, a receiver SPAD array, a SPAD gating circuit, a TDC array, a photon counter, an adder or accumulator, histogram circuitry, memory circuitry and a digital signal processor programmed to perform signal detection.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
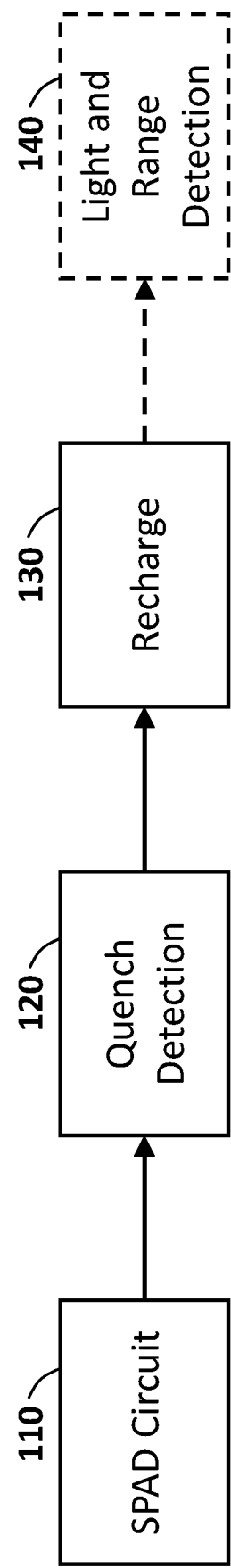
FIG. 1 is a flow chart illustrating an exemplary set of activities and data flow for a SPAD based light and range detection system, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION OF CERTAIN EXAMPLES

Aspects of the present disclosure are believed to be applicable to a variety of different types of apparatuses, systems and methods including those involving the use of a SPAD (Single Photon Avalanche Diode) receiver system to characterize distances to a target and as well as a photon count to characterize signal-to-noise ratio (SNR) of the receiver signal. In certain implementations, aspects of the present disclosure have been shown to be beneficial when used in the context of distance ranging and signal strength determination. This may include areas such as robot navigation, perimeter security, or cartography. In some embodiments, such an asynchronous SPAD receiver system may be beneficial in a Lidar (light detection and ranging) such as implementations used on autonomous vehicles. As a specific example, such a system may be used to quantify 3D information about a target environment such as the roadway in front of a car, such as pedestrian locations, approaching vehicles, etc. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

According to a specific example of the present disclosure, embodiments are directed to or involve a method wherein a SPAD receiver may include a SPAD circuit used to detect incoming photons and using multiple photon detections while using, for example, a single-channel TDC (time-to-digital converter). This exemplary approach may also involve quenching or disarming of the photon detection upon photon detection for a pre-defined OFF period and, in response, recharging the SPAD circuit. The OFF period must be longer than the maximum of TDC timing plus the readout phase. After being recharged, the SPAD circuit may be unquenched (or armed) to allow for photon detection during the subsequent ON period. In various example embodiments, the SPAD circuit may be implemented as one SPAD circuit or a plurality of SPAD circuits arranged to operate in parallel and concurrently.

In other specific examples, the present disclosure is directed a method of using a SPAD receiver for Lidar detection of at least one object. User of the term "object" in such context refers to a physical structure able to reflect the emitted light such as a vehicle in an exemplary vehicular application. In this specific example, the SPAD receiver may be configured so as to operate in an asynchronous mode. The asynchronous mode may allow for multiple photon detections using a single channel TDC. Also, such asynchronous SPAD operation may enable multiple photon detections at a randomized time, thereby achieving uniform signal sensitivity.

In yet another specific example of the instant disclosure, embodiments are directed to or involve a method wherein a SPAD receiver, typically responsive to, having and/or being integrated with a transmitter driver-illuminator arrangement, includes: a receiver SPAD array, a SPAD gating circuit, a TDC array, a photon counter, an adder or accumulator, histogram circuitry, memory circuitry and a digital signal processor programmed to perform signal detection and related calculations such as times of flight or ToF.

Now turning to the drawings, FIG. 1 is a flow chart illustrating an exemplary set of activities with associated data flow for a SPAD based light and range detection system. The SPAD circuitry 110 represents a photon detection circuit which may include one SPAD circuit or multiple cooperatively-operative SPAD circuits for photon detect relative to an object. The photon detection by the SPAD circuitry 110 may operate in an event-driven manner, with subsequent quenching or disarming of the SPAD circuitry 110, as shown at block 120, occurring for a pre-defined period. This pre-defined period of quenching may be referred to as an OFF period for effectively disabling the photon detection by the SPAD circuitry 110. The OFF period is longer than the maximum of TDC timing plus the readout phase. After the OFF period, the SPAD circuitry 110 may be recharged 130 (e.g., for arming) for a subsequent further detection (ON) period. The OFF period may be longer than the after-pulse period to avoid or mitigate device-intrinsic noise-induced photon detection. The individual ON period is determined by photon detection. Following photon detection by the SPAD circuit, light and timing detection 140 is accomplished by further circuitry (as discussed with further examples below).

Figure 2A:
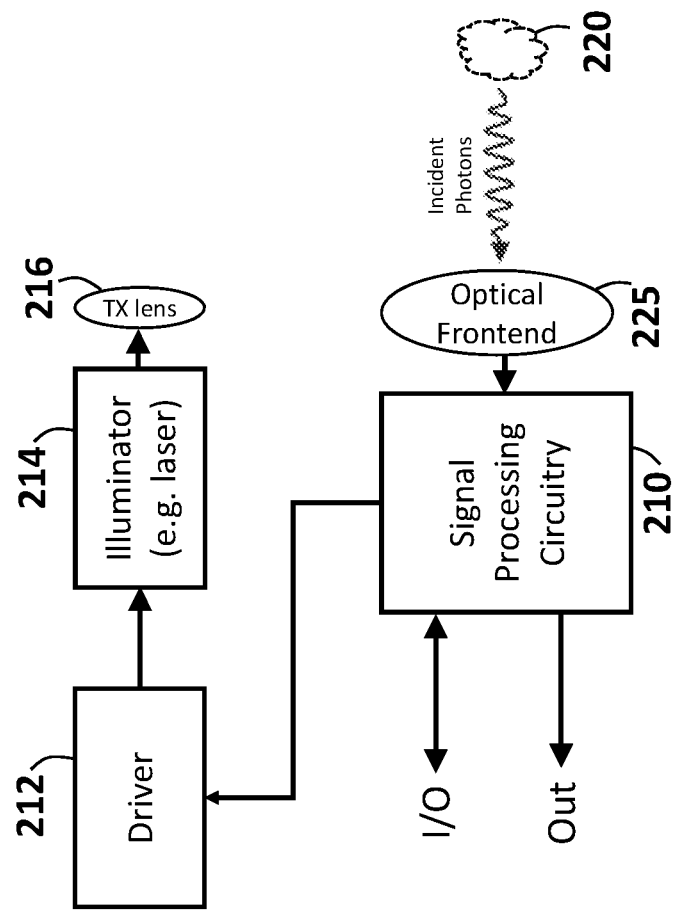
FIG. 2A is a diagram illustrating an example of a SPAD based light and range detection system, in accordance with the present disclosure.

Consistent with the discussion above in connection with FIG. 1, FIG. 2A illustrates an example of a SPAD-based photon detection device and/or system including a transmitter (driver-illuminator-lens) arrangement and a SPAD receiver arrangement, as may be implemented in connection with a Lidar apparatus. In this example, both arrangements are integrated and controlled by a signal processing circuitry 210. The transmitter arrangement includes an optical driver 212 responsive to the control from the signal processing circuitry 210, an illuminator 214 to transmit a pulsed optical (light) output, and a transmitter lens 216 to focus the light towards or at a target area including an object or objects depicted as 220 (being so positioned and not to scale for discussion purposes). The illuminator 214 may be (optionally) powered by the driver circuit 212 which is in turn controlled by the signal processing circuitry 210 as may be implemented a more detailed level (not shown) via a microcontroller circuitry with clock driver and memory circuitry. A portion of the photons transmitted by the illuminator 214 may be reflected by the object 220 in the target area. These incident photons may pass through an optical frontend 225 (e.g., including a lens and light bandpass filter) to respectively focus and filter the returned photons for processing by the signal processing circuitry 210. The signal processing circuitry 210 may also control the driver 212 and such signal processing circuitry 210 may also be implemented to control or include as an integrated set of more specific discrete light-signal processing circuit blocks (e.g., one or more of a SPAD receiver array, a SPAD gating circuit, a TDC array, a photon counter, an adder or accumulator, and histogram circuitry).

Figure 2B:
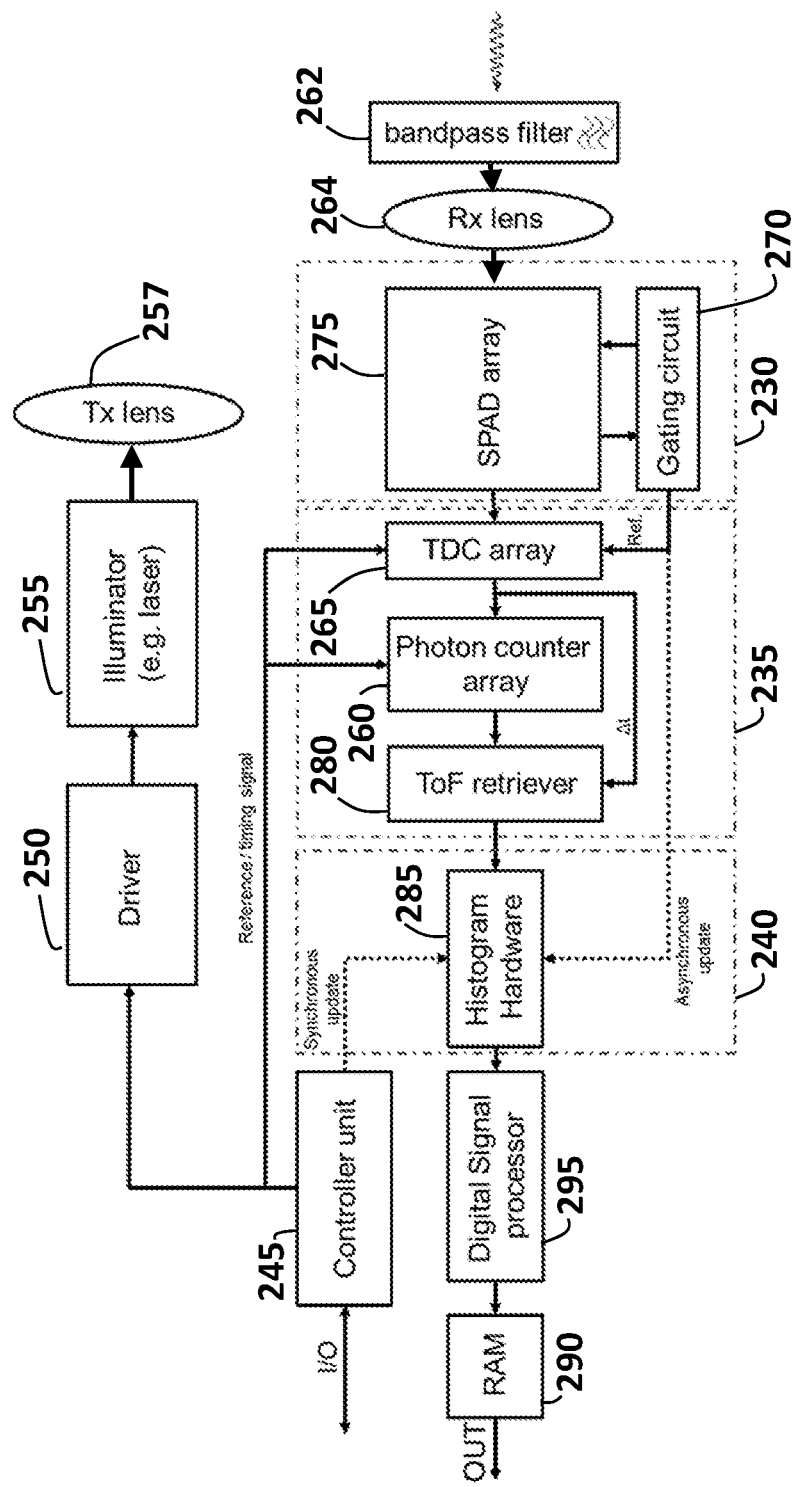
FIG. 2B is a more detailed diagram illustrating an example of a SPAD based light and range detection system, in accordance with the present disclosure.

FIG. 2B illustrates a more detailed example of a SPAD based light and range detection system for possible use in an automotive Lidar system. In this example controller (e.g., microcomputer) 245 is responsible for synchronizing and orchestrating photon timing and processing in both directions, and while cooperating with a transmitter arrangement including: an optical driver 250 responsive to control from the controller 245, an illuminator 255 to transmit a pulsed optical (light) output, and a transmitter lens 257 to focus the light towards or at a target area including an object or objects (not shown). The receiving side of the system in FIG. 2B may include a frontend circuit, as with FIG. 2A, having a filter 262 and lens 264. From the frontend circuit, received light is processed by a light-integration circuit 230 which is used to detect and accumulate (for counting) the number of photons in the light signal passed to the circuit 230 during certain times such as discussed above. A timing circuit 235 draws from the circuit 230 and a timing signal from the controller 245 for counting and ToF processing which, in turn, is used by block 240 which includes a histogram (memory-based array circuit 285) as further discussed below. From block 230, measurement signals developed and output by a digital signal processor 295 for a memory (such as RAM) 290, as may be useful for conventional data associated with Lidar and/or in some examples, with testing or calibration of the system.

More specifically, the controller 245 in FIG. 2B (as may be driven by an internal or external clock) is operated so that the controller 245 may send a timing reference to the illuminator 255 (via the driver circuit 250) and to the circuit 230, photon counter 260 and TDC 265 to synchronize time origins for correct time-of-flight (ToF) estimation. Within block 230, the gating circuit 270 is responsible for the asynchronous operation of SPAD array 275 as well as gating outputs from the SPAD array 275 for time-digital conversion into a TDC array 265. In other specific examples, the SPAD array 275 and/or related photon detection circuitry may operate with an individual gating circuit 270 and any of various forms of TDC 265.

Upon certain levels or a period of detection, signals processed via the SPAD array 275 may be quenched (e.g., disabling the circuit or discarding the results of the detection) for pre-defined OFF period, after which the quenched circuit is recharged for subsequent photon detection. This quenching may be implemented, for example, within block 235 (to suspend flow of detected signals processed via the SPAD array 275 into circuitry of block 240).

In another embodiment, such SPAD circuitry 275 may be grouped with a single gating circuitry 270. During operation, the gating circuitry 270 (and/or its surrounding input/output circuitry) may be controlled to effect the above-discussed quenching, recharging and coarse-timing activities. Although not separately illustrated in FIG. 2B, timing circuitry such as a delay buffer may be used to provide a reference OFF period to the SPAD and TDC to synchronize the timing origin. Alternatively, such a reference may be provided externally. Regardless of the manner in which SPAD activities occur (e.g., individual or clustering as a group), the SPAD circuitry 275 may be locally driven, eliminating the need for high-frequency global clock distribution and thereby reducing clock-based skew over the SPAD array 275.

Continuing with block 235 of FIG. 2B; the timing reference of the TDC array 265 is reset with the ON period for the SPAD occurring at a rising edge, with, the TDC being used to characterize the period from one to the next set of consecutive photon detections. In various examples, the TDC is implemented using dedicated time-to-digital conversion circuitry and/or other alternative implementations as well (e.g., Time-to-Analog Converter (TAC) coupled with Analog-to-Digital Converter (ADC)) as may be appropriate and suitable for providing such time measurement as described herein. Also, in various other related embodiments using the above aspects, the TDC may be integrated in-pixel or shared across columns, rows or other sections via logic circuitry for column/row decoding, multiplexing, etc. Also according to related aspects, examples of the present disclosure may implement operation of such TDCs in both forward and reverse modes (with forward mode implying the serving of reference signal as START and SPAD detection as END signal), and vice versa in reverse mode.

In certain more-detailed experimental embodiments, consistent with each of the above examples, the SPAD circuitry (including at least one SPAD circuit) may be arranged to detect incident light using multiple photon detections in a single-channel TDC. As above, this detection may involve and lead to steps of quenching or disarming the photon detection lasting for a predefined OFF period. During the OFF period, the SPAD circuitry may be recharged. Optionally, the OFF period may be longer than an after-pulse period, associated with the detection time instance, to avoid or mitigate device-intrinsic noise-induced photon detection; as an example, via testing of the circuitry and/or other experimentally-based estimates, this OFF period may be set sufficiently long to render such device-intrinsic noise-induced photon detection as being negligible and to include and account for the time needed by TDC circuitry for processing the most recent photon detections. After being recharged, the SPAD circuitry may be unquenched (or re-armed) to allow for photon detection during the subsequent ON period.

In such specific examples consistent with FIG. 2B, the ToF retriever 280 of block 235 may incorporate the photon counts from a photon counter array 260 and a TDC output (from the TDC array 265) to estimate actual ToF and, from which a ToF storage and readout scheme is used for further processing. As an example, from the ToF retriever 280 of block 235, such data may be processed by first storing the data in a memory array such as a histogram circuit 285 from which the illustrated digital signal processor 295 retrieves and outs via a memory circuit (RAM) 290.

Other examples may specify different hardware (i.e., circuitry) requirements. In one example (not shown), such hardware uses an adder to increment ToF data as it arrives and, in a related example, synchronous readout may be implemented with additional memory to store multiple ToFs. Alternatively, incremented ToF data may be readout in an event-driven manner. In these and the above examples, the maximum number of ToFs per acquisition cycle may inversely proportional to the OFF period. Similarly, histogram data, generated in the histogram circuit 285, may be updated with every range (as targeted by the transmitter arrangement) synchronously or in an event-driven manner. After a number of acquisition cycles (or equivalently measurements), the histogram in circuit 285 may be communicated to digital signal processing block 295, where target distance may be determined. The control clock will vary depending on the implementation (as shown as dotted lines to reflect synchronous updating and/or asynchronous updating). The multiple blocks such as 230, 235, 240 in FIG. 2B may or may not be integrated into single form-factor, as may be specified in connection with circuit-performance requirements or specifications.

Consistent with the examples illustrated in FIGS. 1, 2A and 2B, FIG. 3 is a flow chart illustrating an exemplary set of activities and/or data flow for a single-pixel-chain SPAD-based light and range detection system. In this example, the SPAD and TDC (in forward mode) are operated asynchronously and an event-driven readout is implemented in one of the manners as discussed above in connection with FIG. 2B. Block 310 begins the process by having the controller (or control unit such as 245 of FIG. 2B) activate the transmitter arrangement for causing light to be transmitted towards a target area for detection of an object in the target area. The TDC and counter are reset (block 320) after each acquisition cycle, synchronized to acquisition the clock cycle. Upon reflected photon detection (block 330), the SPAD may be held OFF (quenched) for pre-determined time. Also, as shown in 340, upon photon detection the photon counter is incremented and the TDC is read. Next the ToF is calculated using the new timing data and the previous timing data as depicted at block 350. In various more specific example embodiments, the OFF period is longer than the after-pulse period, in certain instances, by approximately five percent to twenty-five percent depending on certain design-specific factors. Such factors may include, as examples, the extent to which device-intrinsic noise-induced photon detection is to be avoided and/or being sure the OFF period includes the time required for (to account for) the TDC conversion and readout period. In other of these and related examples, the OFF period may be set longer than the after-pulse period by a degree that is at least sufficient to account for the TDC conversion time and to avoid/mitigate more than negligible device-intrinsic noise-induced photon detection and not so large that the full target range with specified (e.g., uniform) sensitivity becomes undermined.

As represented by block 360, the SPAD is recharged (e.g., by applying excess bias voltage), thus returning to a Geiger mode for the subsequent detection. In the above-discussed examples, the SPAD may not be synchronized to the acquisition cycle clock and may continue operating until the subsequent detection. Thus, over the image frame, detection range is covered uniformly in daylight condition. Assuming a constant incident noise photon rates, the probability that a target return photon ($P_B$) is blocked may be set according to by the incident photon rates and the dead time as follows:

$$P_B = \frac{r_{NOISE} T_{DEAD}}{1 + r_{NOISE} T_{DEAD}} \qquad \text{(Eqtn. 1)}$$

where $r_{NOISE}$ denotes noise photon detection rate and $T_{DEAD}$ denotes the dead time. Photon detection probability for a SPAD ($P_D$) can be modelled with binomial distribution and with background light following the Poisson distribution. Then, photon detection probability can be expressed as:

$$P_D \approx \left(1 - \frac{r_{NOISE} T_{DEAD}}{1 + r_{NOISE} T_{DEAD}}\right)(1 - \exp(-rt)) \qquad \text{Eqtn. 2}$$

where r denotes target-return photon detection rate. The interpretation of the photon detection probability may be understood as follows: the first term is the probability that the SPAD has not been triggered by noise for the dead time prior to detection, and the second term is the target-return photon detection probability at time t which probability decreases exponentially over time. Accordingly, ToF of detections may be updated and stored in histogram as at block 370. As depicted at block 380, the histogram data may then be output for further processing as at block 390, such as to the digital processing circuitry 295 and the memory circuit 290 of FIG. 2B, for calculation of distance to target, among other items. Note that, in this example, blocks 310 through 360 may be repeated multiple times as required. Similarly blocks 330 through 360 may be repeated as needed to complete a detection frame.

Figure 4:
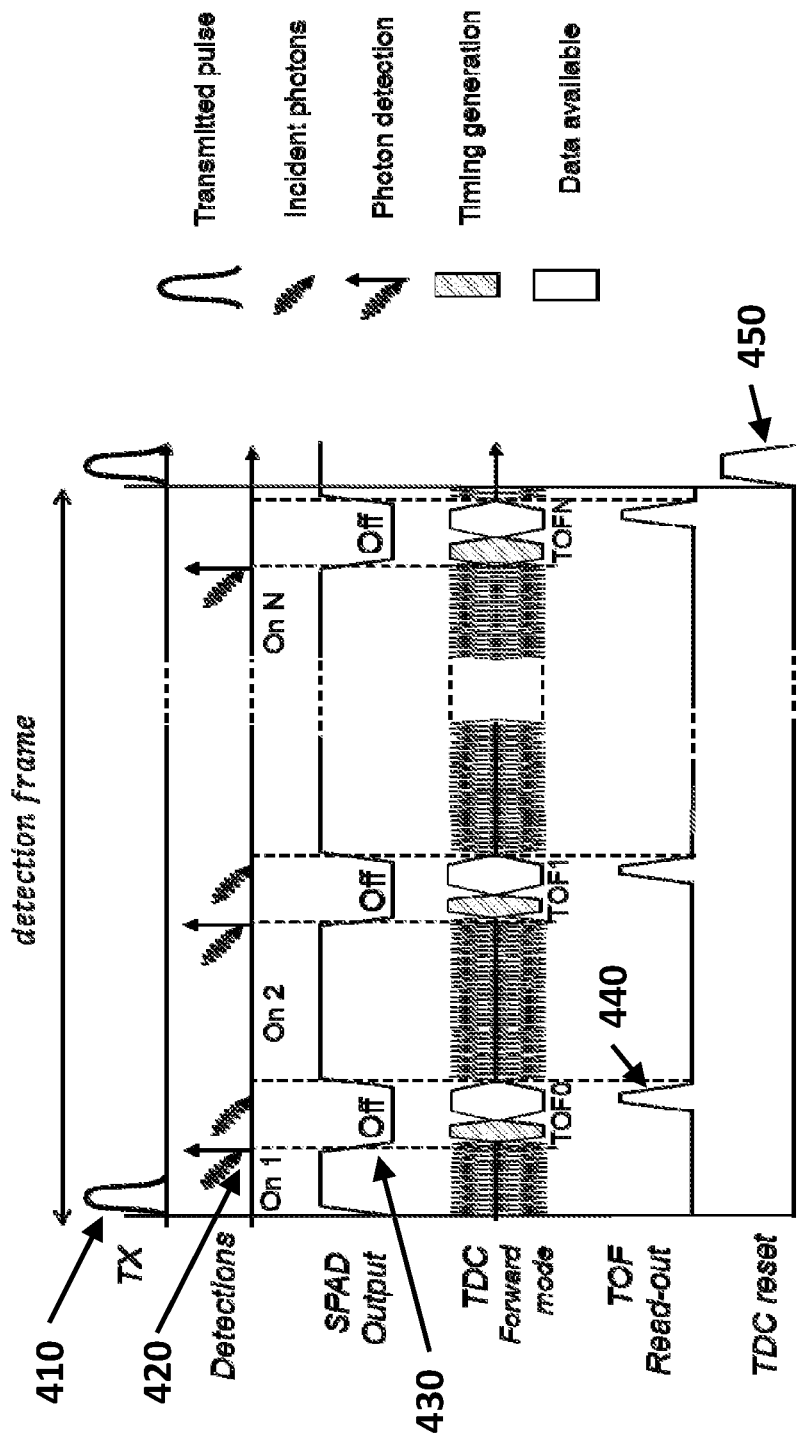
FIG. 4 is a diagram illustrating activities and signal versus time in an exemplary SPAD based light and range detection system, in accordance with the present disclosure.

In connection with an experimental embodiment, FIG. 4 shows an example timing diagram during an acquisition cycle of asynchronous SPAD operation with transmissions being illustrated as 410. The diagram illustrates some of the events that may occur in connection with a detection frame (e.g., time between transmissions). At 420, the vertical lines identify incident photon triggering via photon detection circuitry as exemplified in the previously-discussed examples. This subsequently triggers the involved SPAD circuitry to OFF thereby quenching the detection as at 430. The SPAD is later turned back ON by controller circuitry (not shown) and armed to signal the next photon detection. After a period of time following photon detection, the calculated result is read out as depicted at 440. When a detection frame has been satisfied the TDC is reset as depicted at 450.

Figure 5:
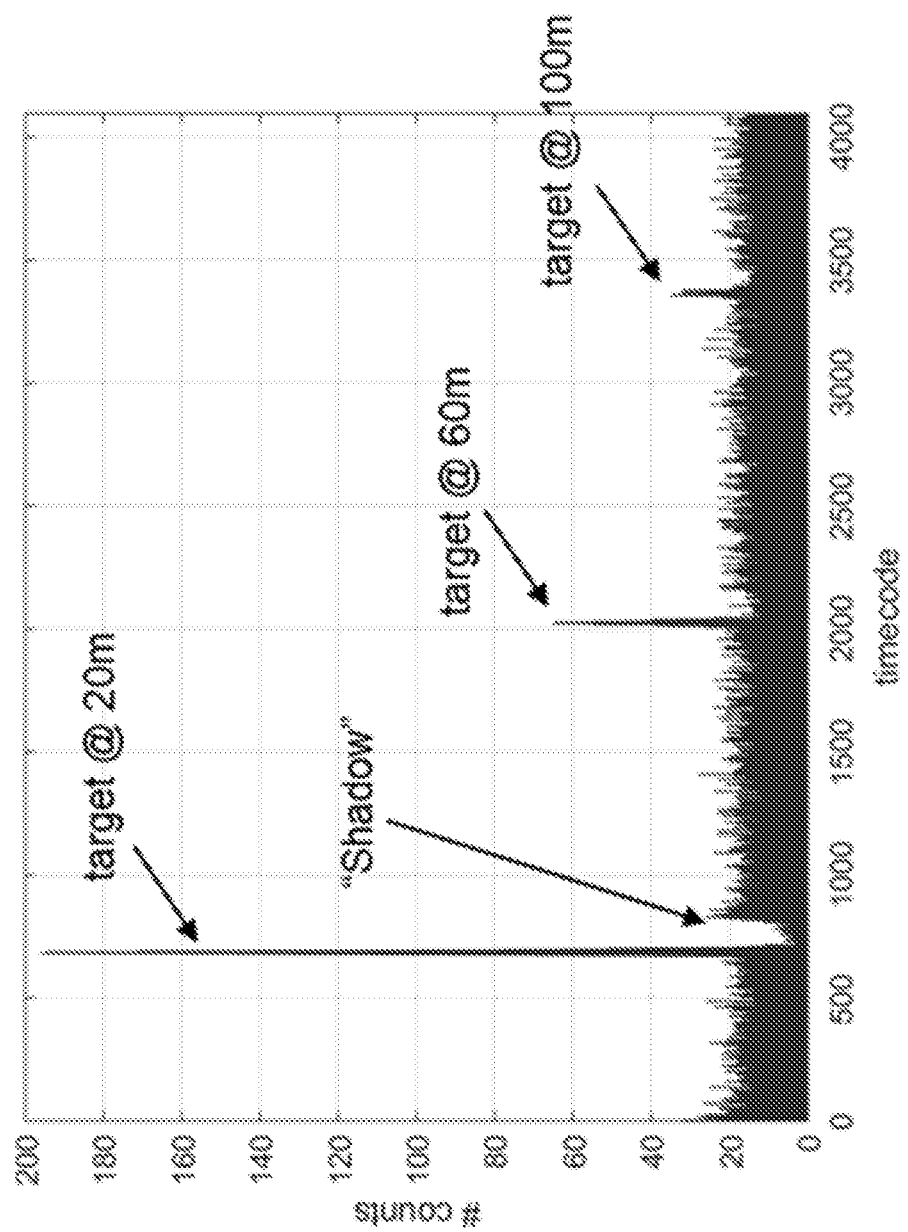
FIG. 5 is a chart of the number of photon counts versus time using data from an exemplary SPAD based light and range detection system, in accordance with the present disclosure.

In connection with a related experimental embodiment, FIG. 5 is a chart showing number of photon counts versus time based on data obtained from an exemplary SPAD based light and range detection system, also in accordance with above examples of the present disclosure, operating with asynchronous gating and in high background noise environment. In this example, asynchronous operation allows detection at distance ranges including 100 m. The significant signal-to-noise ratio is attributable to a plurality of photon detections per acquisition. The abrupt decrease in photon counts shown in FIG. 5, as shown following the return signal, is a shadowing effect. The increase in return signal photon rates at target distances results in the increased photon blockage probability at as shown in the shadow or shaded regions (as may be characterized in connection with Equation 2 above). The effect is position-dependent (as apparent following the target return signal) and with signal strength dependence manifested by increased photon detection rates results as shown in pronounced effect. Even in a relatively noisy environment, according to examples of the present disclosure, such effective photon detection may occur in a single acquisition cycle, and with surprisingly high SNR is achieved at the retained frame rates. Also, the random nature of background light triggers SPAD(s) at random moments which theoretically covers the full target range with uniform sensitivity over a plurality of measurements, thereby reducing cluster edge effects. Additionally, the number of photon counts per measurement leads to increased photon counts per frame, achieving improved signal-to-noise ratio than would be otherwise achieved. In certain specific examples using the above-characterized implementations (e.g., as depicted in FIG. 2B), the number of photon detections per acquisition cycle is inversely proportional to the OFF period and background noise.

Terms and illustrations to exemplify orientation, such as left/right, up/down and above/below, may be used herein to refer to relative positions of elements as shown in the figures for discussion only of such examples according to the present disclosure. It should be understood that the terminology is used for notational convenience only and that in actual use such disclosed aspects may be oriented different from the orientation shown in the figures and/or as otherwise discussed.

It will also be appreciated that example aspects of the present disclosure are presented to describe and/or illustrate useful implementations of various circuits or circuitry which may be illustrated as or using terms such as blocks, modules, device, system, unit, controller, and/or other circuit-type depictions (e.g., reference numerals 245 of FIG. 2B depict a block/module as described herein). Such circuits or circuitry are used together with other elements to exemplify how certain embodiments may be carried out in the form or structures, steps, functions, operations, activities, etc. As examples, wherein such circuits or circuitry may correspond to logic circuitry (which may refer to or include a code-programmed/configured CPU), in one example the logic circuitry may carry out a process or method (sometimes "algorithm") by performing "histogram update" and also "calculate ToF" and in another example, the logic circuitry may carry out a process or method by performing these same activities/operations and in addition, also "SPAD is recharged" followed by or in connection with "Histogram sent for further digital signal processing".

Figure 3:
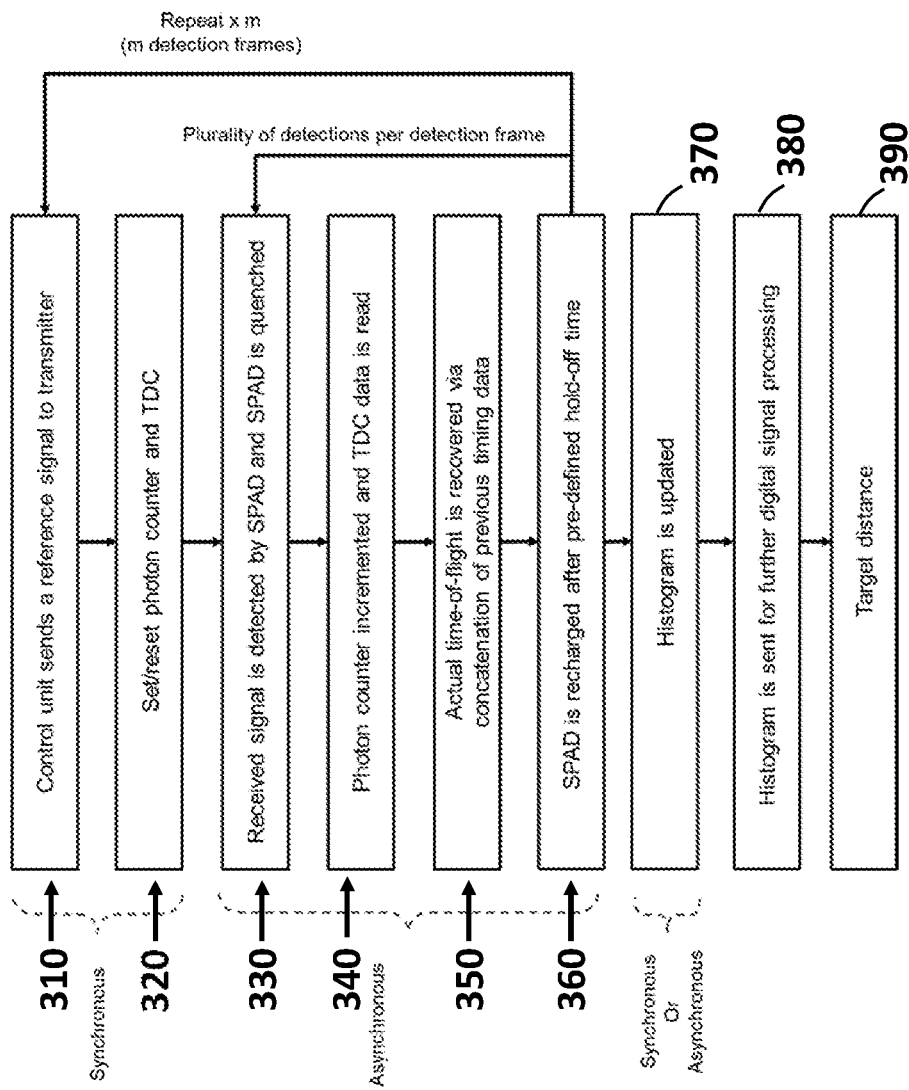
FIG. 3 is a flow chart illustrating an exemplary set of activities and/or data flow for a SPAD based light and range detection system, in accordance with the present disclosure.

For example, in certain of the above-discussed embodiments, one or more modules are discrete logic circuits or programmable logic circuits configured and arranged for implementing these operations/activities, as may be carried out in the approaches shown in FIGS. 2A and 2B. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in FIG. 3 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps, for instance, steps in FIG. 3. Such modifications do not depart from the true spirit and scope of various aspects of the disclosure, including aspects set forth in the claims

What is claimed is:

1. A method comprising: operating a SPAD receiver, having SPAD circuitry for photon detection, with multiple photon detections using a single-channel TDC (time-to-digital converter); and quenching the photon detection by the SPAD circuitry upon photon detection for effecting a pre-defined OFF period, and in response, recharging the SPAD circuitry for a subsequent ON period during which SPAD circuitry is unquenched for photon detection.

2. The method of claim 1, further including using the SPAD receiver for Lidar (Light Detection and Ranging) detection of at least one object, and wherein the step operating a SPAD receiver includes asynchronous operation to enable the multiple photon detections using the single-channel TDC.

3. The method of claim 1, wherein the OFF period is longer than an after-pulse period, associated with the detection time instance.

4. The method of claim 1, wherein the OFF period is sufficiently longer than an after-pulse period, associated with the detection time instance, to account for circuit delay associated with processing of previously-detected photons and for avoiding or mitigating device-intrinsic noise-induced photon detection.

5. The method of claim 1, wherein the single-channel TDC is operated is driven in response to events for measuring time difference between sets of two consecutive photon counts, and recording time-difference measurements for corresponding Times-of-flight (ToF) data associated with respective photon detections.

6. The method of claim 5, further including retrieving, and storing in at least one histogram, the Time-of-flight (ToF) data associated with the respective photon detections.

7. The method of claim 1, wherein the SPAD receiver includes a TDC, and wherein the OFF period is longer than an after-pulse period, associated with the detection time instance, to avoid device intrinsic noise-induced photon detection.

8. The method of claim 1, wherein the SPAD receiver includes a transmitter illuminator, a transmitter driver, a receiver SPAD array, a SPAD gating circuit, a TDC array, a photon counter, histogram circuitry, memory circuitry and a digital signal processing computer programmed to perform signal detection.

9. The method of claim 1, wherein the SPAD receiver includes a photon counter, a time-to-digital converter (TDC), and a controller which controls a transmitter that sends light pulses to which the SPAD receiver responds, and wherein the controller further controls the TDC and counting of detected light energy by a photon counter.

10. The method of claim 1, wherein the SPAD receiver includes a photon counter, a time-to-digital converter (TDC), and a controller which controls the TDC and effective processing of detected light energy by causing the quenching and the recharging.

11. The method of claim 10, wherein in response to the recharging, the controller causes a histogram circuit to be updated.

12. An apparatus comprising:
a SPAD receiver having SPAD circuitry to detect photons via multiple photon detection using a single-channel TDC (time-to-digital converter);
a circuitry to cause quenching of the photon detection by the SPAD circuitry for effecting a pre-defined OFF period; and
in response, recharging the SPAD circuitry for a subsequent ON period during which SPAD circuitry is unquenched for photon detection.

13. The apparatus of claim 12, further including a processing circuit to process outputs of the SPAD receiver for Lidar (Light Detection and Ranging) detection of at least one object, and wherein the SPAD receiver includes an asynchronous operation mode to enable the multiple photon detections using the single-channel TDC.

14. The apparatus of claim 12, wherein the OFF period is longer than an after-pulse period, associated with the ON detection time instance.

15. The apparatus of claim 14, wherein the SPAD receiver avoids or mitigates device-intrinsic noise-induced photon detection.

16. The apparatus of claim 12, wherein the single-channel TDC is to be driven in response to events for measuring time difference between sets of two consecutive photon counts, and where the SPAD receiver is to record time-difference measurements for corresponding Times-of-flight (ToF) for respective photon detections.

17. The apparatus of claim 16, further including circuitry to retrieve and store in a histogram, Time-of-flight (ToF) data associated with the respective photon detections.

18. The apparatus of claim 12, wherein the SPAD receiver includes a TDC, and wherein the OFF period is longer than an after-pulse period, associated with the detection time instance, to avoid or mitigate device-intrinsic noise-induced photon detection and to account for processing time associated with the TDC.

\* \* \* \* \*